United States Patent
Miyamoto

(10) Patent No.: US 6,708,863 B2
(45) Date of Patent: Mar. 23, 2004

(54) HEAT BONDING METHOD AND HEAT BONDING DEVICE

(75) Inventor: Takehiko Miyamoto, Ebina (JP)

(73) Assignee: Shibaura Mechatronics Corporation, Yokohama (JP)

( * ) Notice: Subject to any disclaimer, the term of this patent is extended or adjusted under 35 U.S.C. 154(b) by 0 days.

(21) Appl. No.: 10/022,445

(22) Filed: Dec. 20, 2001

(65) Prior Publication Data

US 2002/0084310 A1 Jul. 4, 2002

(30) Foreign Application Priority Data

Dec. 21, 2000  (JP) ..................................... P2000-388532

(51) Int. Cl.[7] ......................... B23K 13/05; B23K 15/02; B23Q 15/00; B23Q 16/00
(52) U.S. Cl. ................ 228/8; 228/9; 228/11; 228/12
(58) Field of Search .......................... 228/8, 9, 10, 11, 228/12, 56.5

(56) References Cited

U.S. PATENT DOCUMENTS

| | | | | |
|---|---|---|---|---|
| 3,838,274 A | * | 9/1974 | Doubek et al. ............... 250/548 |
| 5,022,580 A | * | 6/1991 | Pedder ....................... 228/56.3 |
| 5,188,280 A | * | 2/1993 | Nakao et al. ............... 228/123.1 |
| 5,292,050 A | * | 3/1994 | Nagaoka et al. ................ 228/4.5 |
| 5,474,224 A | * | 12/1995 | Nishimaki et al. ........... 228/102 |
| 5,516,023 A | * | 5/1996 | Kono ......................... 228/4.5 |
| 5,566,876 A | * | 10/1996 | Nishimaki et al. ........... 228/102 |
| 5,611,481 A | * | 3/1997 | Akamatsu et al. ......... 228/180.22 |
| 5,678,304 A | * | 10/1997 | Soper .......................... 29/840 |
| 5,748,827 A | * | 5/1998 | Holl et al. ................... 385/134 |
| 5,816,473 A | * | 10/1998 | Nishikawa et al. ........... 228/6.2 |
| 5,816,477 A | * | 10/1998 | Shimizu ...................... 228/102 |
| 5,862,588 A | * | 1/1999 | Heim et al. .................... 29/840 |
| 5,878,943 A | * | 3/1999 | Nishikawa et al. ........... 228/205 |
| 5,886,971 A | * | 3/1999 | Feldman et al. ......... 369/112.05 |
| 6,053,395 A | * | 4/2000 | Sasaki .................... 228/180.22 |
| 6,068,175 A | * | 5/2000 | Heim et al. .................... 228/45 |
| 6,084,782 A | * | 7/2000 | Huynh et al. ................. 361/777 |
| 6,129,259 A | * | 10/2000 | Stansbury .................... 228/105 |
| 6,135,340 A | * | 10/2000 | Stansbury ....................... 228/9 |
| 6,137,693 A | * | 10/2000 | Schwiebert et al. ........ 361/803 |
| 6,153,853 A | * | 11/2000 | Maruyama et al. ...... 219/121.63 |
| 6,193,132 B1 | * | 2/2001 | Shibata et al. .............. 228/103 |
| 6,204,471 B1 | * | 3/2001 | Kurihara ................ 219/121.62 |
| 6,337,489 B1 | * | 1/2002 | Matsumoto et al. ... 250/559.08 |
| 6,467,673 B2 | * | 10/2002 | Enokido et al. ............ 228/105 |

* cited by examiner

*Primary Examiner*—M. Alexandraelve
*Assistant Examiner*—Colleen P. Cooke
(74) *Attorney, Agent, or Firm*—Oblon, Spivak, McClelland, Maier & Neustadt, P.C.

(57) ABSTRACT

In heat bonding method and device, first and second marks (MA, MB) formed on the film carrier (52) are measured before performing heat bonding of outer leads (54) formed on a film carrier (52) to electrodes (58) formed on a transparent plate (56), where an expansion amount of the film carrier (52) is changed according to a condition of the heat bonding. A distance between the measured marks (MA, MB) is then obtained. The condition for the heat bonding is determined based on this distance. The heat bonding is performed under this condition determined.

4 Claims, 5 Drawing Sheets

|  | CONDITION 1 | CONDITION 2 | CONDITION 3 |
|---|---|---|---|
| BONDING TEMPERATURE | A1(STANDARD) | A2(HIGH) | A3(LOW) |
| BONDING TIME | B1(STANDARD) | B2(SHORT) | B3(LONG) |
| BONDING LOAD | C1(STANDARD) | C2(HIGH) | C3(LOW) |
| DOWNWARD SPEED | D1(STANDARD) | D2(HIGHER) | D3(SLOWLY) |
|  | (STANDARD) | (SMALL EXPANSION) | (LARGE EXPANSION) |

HEAT BONDING METHOD AND HEAT BONDING DEVICE

CROSS REFERENCE TO RELATED APPLICATIONS

This application is based upon and claims the benefit of priority from prior Japanese Patent Application P2000-388532 filed on Dec. 21, 2000; the entire contents of which are incorporated by reference herein.

BACKGROUND OF THE INVENTION

1. Field of the Invention

The present invention relates to a heat bonding method and a heat bonding device for bonding a first component part and a second component part. Still more particularly, the invention relates to a preferred heat bonding method and a preferred heat bonding device for performing a heat bonding between outer leads of electronic parts such as tape carrier package and electrodes formed on a substrate such as a display panel.

2. Description of the Related Art

A plurality of electronic parts are mounted, as drivers for a display panel, on electrodes which are formed, with a narrow pitch, on peripheral sections of the display panel which will be used as a display device for electronic devices.

FIGS. 6A and 6B are diagrams explaining a conventional heat bonding method for outer leads of electronic parts. In particularly, FIG. 6A shows a state before the heat bonding and FIG. 6B shows a state after the heat bonding.

An electronic part 51 is formed by bonding to a bare chip 53 a film carrier 52 made of a polyimide resin and others. On a surface of the film carrier 52, a plurality of outer leads 54 made of copper, etc. are formed with a narrow pitch.

In the peripheral sections of a transparent plate 56, a plurality of microelectrodes 58 are formed with a narrow pitch. At both ends of the film carrier 52, first and second marks MA and MB for position detection are formed with a predetermined distance. On the other hand, at both the ends of the string of the microelectrodes 58 formed on the transparent plate 56, first and second marks NA and NB are formed, which correspond to the first and second marks MA and MB. Both the marks MA and NA and both the marks NB and NB are used as pair, respectively.

At first, in the state before performing the heat bonding shown in FIG. 6A, a difference in position between the first marks MA and NA is detected, and a difference in position between the second marks MB and NB by using a camera (not shown) is detected.

Next, the outer leads 54 and the microelectrodes 58 are positioned so that the difference between the pair of the first marks MA and NA becomes equal to the difference between the pair of the second marks MB and NB. Then, a bonding member (not shown) is pressed to the film carrier 52 in order to perform the heat bonding between the outer leads 54 and the corresponding microelectrodes 58 (see FIG. 6B). The outer leads 54 are thereby bounded to the corresponding microelectrodes 58 by the heat bonding, so that the electronic part 51 is mounted on the transparent plate 56 of the display panel.

Because the outer leads 54 are formed with a narrow pitch on the surface of the film carrier 52, it is necessary to perform the heat bonding after the completion of accurate positioning between the outer leads 54 and the microelectrodes 58 of the display panel.

However, because the film carrier 52 is made of a polyimide resin and others, the film carrier 52 is expanded during the heat bonding. In an actual case, the film carrier 52 is formed shorter in length in consideration of its expansion during the heat bonding. Because a manufacturing error occurs, even if the heat bonding is performed under a same condition, there happens that it is difficult to bond the outer leads 54 to the corresponding microelectrodes 58 in accurate position, so that faulty products are manufactured. In the related art, the condition of the heat bonding is reviewed every occurring faulty product. In the future, it can be predicted that narrowing a pitch will cause the increasing of the number of faulty products.

In order to avoid the drawback of the related art described above, a method to suppress the rate of faulty products has been proposed. In this method, the state of the heat bonding is observed, and the condition of the heat bonding that will be performed in a following process is reviewed as necessary based on data obtained by this observation.

However, a manufacturing error in a film carrier after the completion of the heat bonding is not always equal to a manufacturing error involved in a film carrier before the performing of the heat bonding. Thereby, there is a drawback that a condition for the heat bonding determined based on the data obtained from a film carrier to which the heat bonding has been performed can not be applied to following film carriers.

SUMMARY OF THE INVENTION

An aspect of the present invention provides a heat bonding method and a heat bonding device capable of suppressing an incidence of faulty products even if manufacturing errors in component parts are not always equal to each other.

In a heat bonding method and a heat bonding device according to an embodiment of the present invention, the heat bonding between first and second component parts is performed, wherein an expansion amount of the first component part is changed according to a condition of the heat bonding. First and second marks formed on the first component part is detected before performing the heat bonding. A distance between the first and second marks detected is then obtained. An optimum condition for the heat bonding is determined based on the distance obtained. The heat bonding is performed for the first and second component parts under the optimum condition determined above.

DETAILED DESCRIPTION OF EMBODIMENTS

Figure 1:
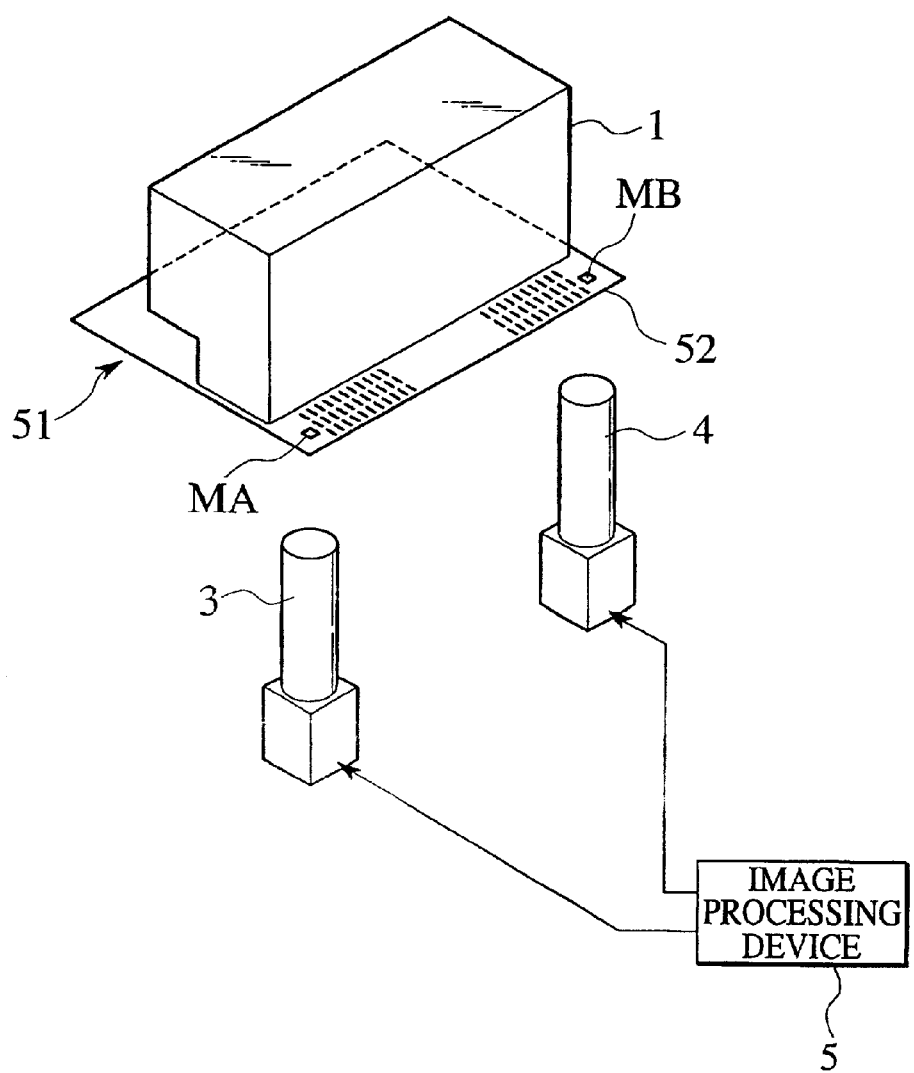
FIG. 1 is a partially perspective view of a distance measurement section for measuring a distance between marks.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Embodiment

Figure 2:
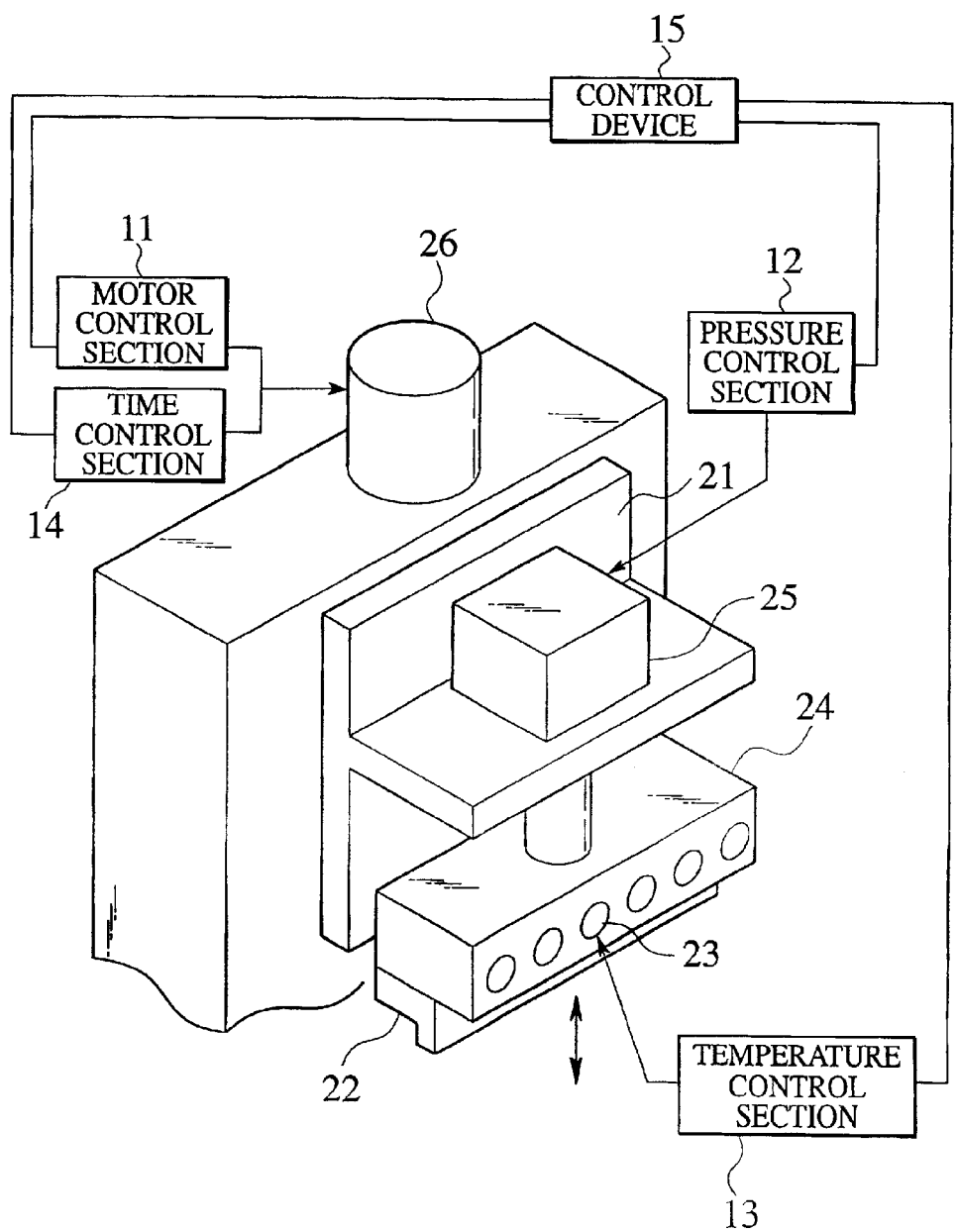
FIG. 2 is a partially perspective view of a bonding section.
Figure 3:
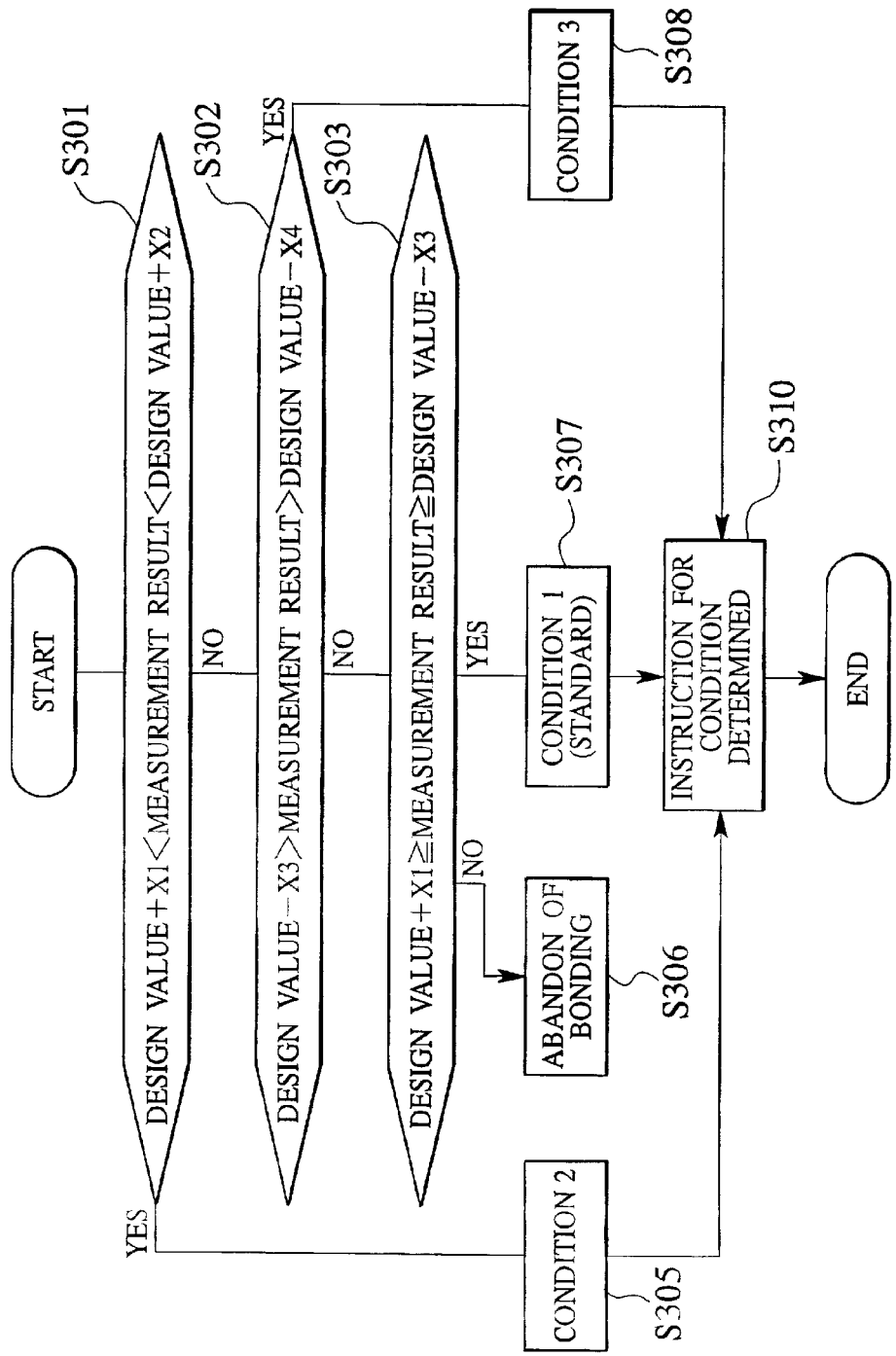
FIG. 3 is a flow chart to explain a determining method of determining a condition of the heat bonding.
Figures 4, 5:
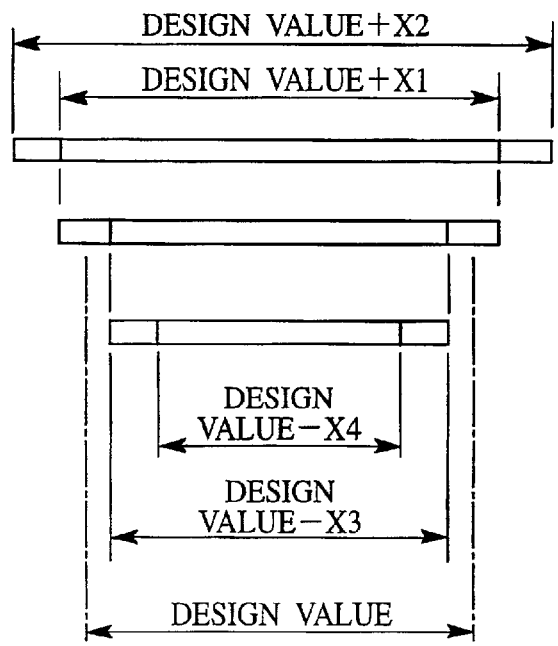
FIG. 4 is a diagram showing an inequality relationship among various values such as "a design value"+X1" shown in FIG. 3.
FIG. 5 is a table showing a concrete example of the conditions of the heat bonding.

FIG. 1 is a partially perspective view of a distance measurement section for measuring a distance between marks. FIG. 2 is a partially perspective view of a bonding section. FIG. 3 is a flow chart to explain a determining method of determining a condition of the heat bonding. FIG. 4 is a diagram showing inequalities of "design value+1" and others shown in FIG. 3. FIG. 5 is a table showing a concrete example of the conditions of the heat bonding. In the following explanation, the same components in the related art shown in FIGS. 6A and 6B will be used with the same reference characters and numbers, and the explanation for the same components are omitted here.

In FIG. 1, a nozzle 1 performs vacuum absorption for the film carrier 52 in the electronic part 51 (as a first component part) by using a vacuum absorption means (not shown). A camera 3 (as an image pickup device) pickups the first mark MA and a camera 4 (as another image pickup device) pickups the second mark MB. An image processing device 5 then obtains a distance between those marks MA and MB based on the images obtained through the cameras 3 and 4.

FIG. 2 is a partially perspective view of the bonding section. A bonding tool 22 in a bonding head 21 is mounted on a block 24 with a heater 23. This block 24 is fixed to an operation axis of a cylinder 25. The bonding head 21 can be moved up and down by driving a servo motor 26.

A motor control section 11 controls a downward speed of the bonding tool 22, and a time control section 14 controls a bonding time. A pressure control section 12 controls a pressure power of the bonding tool 22. A temperature control section 13 controls a temperature of the bonding tool 22 during the heat bonding.

A control device 15 controls the entire operations of the motor control section 11, the pressure control section 12, the temperature control section 13, and the time control section 14. The control device 15 has a memory device for storing various conditions of the heat bonding according to an amount of manufacturing error (a difference in position between an actual distance and a design value regarding the first mark MA and the second mark MB) of the film carrier 52 shown in FIG. 5. The control device 15 is also connected to an image processing device 5 and, as will be described later, automatically determines the condition during the heat bonding for performing the heat bonding of the electronic part 51 onto the transparent plate 56 (as the second part) by the bonding tool 22 based on a detection result transferred from the image processing device 5.

Next, a description will be given of the explanation of the determining method of determining an optimum condition for the heat bonding with reference to FIG. 3.

FIG. 4 shows an inequality relationship among "design value+X2", "design value+X1", "design value", "design value−X3", and "design value−X4", where X1, X2, X3, and X4 are positive numbers and the relationships "X1<X2" and "X3<X4" are satisfied.

First, in Step S301, it is checked whether or not the measurement result of the distance D1 (see FIG. 6A) between the first mark MA and the second mark MB is greater than "design value+X1" and smaller than "design value+X2". When the above relationship is satisfied, a current condition for the heat bonding is replaced to the condition 2 (Step S305), and the instruction to initiate the heat bonding under the condition 2 is issued (Step S310).

As shown in FIG. 5, when compared with the condition 1 as a standard condition for the heat bonding, the condition 2 indicates a higher temperature, a shorter time, a heavy load, and a higher downward speed of the bonding tool 22. When the heat bonding is performed under the condition 2, the amount of the expansion of the film carrier 52 becomes small, when compared with a case under the condition 1.

In a case where the length of the film carrier 52 is longer than the design value in order to perform the heat bonding under the standard condition, the result of the check in Step S301 indicates "YES". However, because an amount of the expansion of the film carrier 52 can be suppressed by performing the heat bonding under the condition 2, it is possible to avoid occurrence of any faulty product.

When the result of the check in Step S301 indicates "NO", it is further checked in Step S302 whether or not the measurement result of the distance D1 is greater than "design value−X4" and smaller than "design value−X3". When the above relationship is satisfied, the condition 3 is selected for the heat bonding (Step S308), and the instruction to initiate the heat bonding based on the condition 3 is issued (Step S310).

As shown in FIG. 5, when compared with the condition 1 as the standard condition, the condition 3 indicates a lower temperature, a longer time, a lighter load, and a lower downward speed of the bonding tool 22. When the heat bonding is performed under the condition 3, the amount of the expansion in the film carrier 52 becomes larger, when compared with a case under the condition 1.

In a case where the length of the film carrier 52 is shorter than the design value in order to perform the heat bonding under the standard condition, the result of the check in Step S302 indicates "YES". However, because an amount of the expansion of the film carrier 52 can be increased by performing the heat bonding under the condition 3, it is possible to avoid occurrence of any faulty product.

When the result of the check in Step S302 indicates "NO", it is further checked in Step S303 whether or not the measurement result of the distance D1 is not less than "design value−X3" and not more than "design value+X1". When the above relationship is satisfied "YES", the condition 1 is selected as a normal condition for the heat bonding (Step S307), and the instruction to initiate the heat bonding based on the condition 1 is issued (Step S310).

In a case where the heat bonding is performed under the standard condition, the result of the check in Step S303 indicates "YES". Accordingly, when the heat bonding is performed under the condition 1, it is possible to avoid occurrence of faulty products.

When the result of the check in Step S303 indicates "NO", the heat bonding is abandoned (Step S306).

The case of the result of the check in Step S303 indicating "NO" is only that the film carrier 52 is too long or too short in comparison to the design value. In this case, it is difficult to avoid the occurrence of faulty products. Accordingly, the performing of the heat bonding must be abandoned.

Figure 6A:
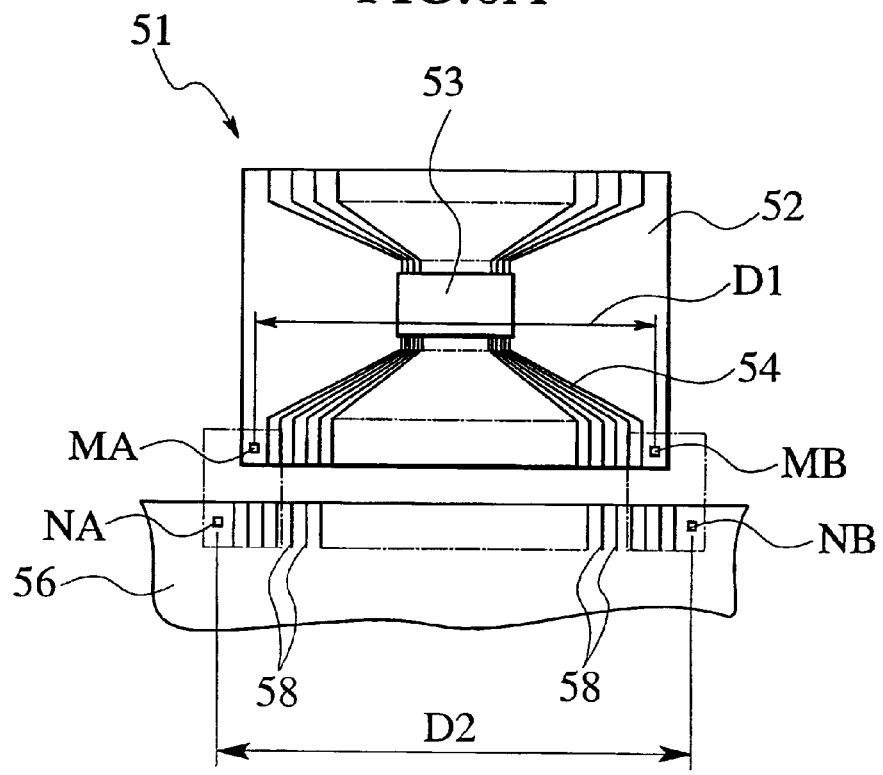
FIGS. 6A and 6B are diagrams explaining the heat bonding method of a related art.

In the execution of the heat bonding based on each heat bonding condition, a difference in position between the first mark MA formed on the film carrier 52 and the first mark NA (corresponding to the first mark MA) formed on the transparent plate 56 as the target for the heat bonding, for example, as shown in FIG. 6A and a difference in position between the second mark MB formed on the film carrier 52 and the second mark NB (corresponding to the second mark MB) formed on the transparent plate 56 are detected by the cameras 3 and 4, respectively. The relative positioning between the outer leads 54 and the electrodes 58 is performed so that the amounts of both the differences in position described above become uniform. This manner is the same of the conventional manner.

As described above, the distance between the marks on the film carrier is measured before performing the heat bonding, and the optimum condition for the heat bonding is selected, or the performing of the heat bonding is stopped according to the distance as the measurement result, it is thereby possible to decrease the incidence of faulty products.

In the embodiment described above, only the distance between the marks on the film carrier is measured, and the condition for the heat bonding is changed according to the distance as the measurement result. The reason why is as follows: The material of the transparent plate 56 is, in general, a glass plate which has a property of an extremely higher accuracy in dimension, and it is difficult to deform it after a circuit fabrication process.

However, when a target material to the film carrier in the heat bonding is a material of low in dimensional precision or a resin of easy in deformation after the circuit fabrication process, it is desirable that the distance between the marks on the target material for the heat bonding is also measured in addition to the measuring of the distance between the marks on the film carrier and the optimum condition for the heat bonding is then determined based on the comparison result of the distances between the marks on the film carrier and between the marks on the target material.

Figure 6B:
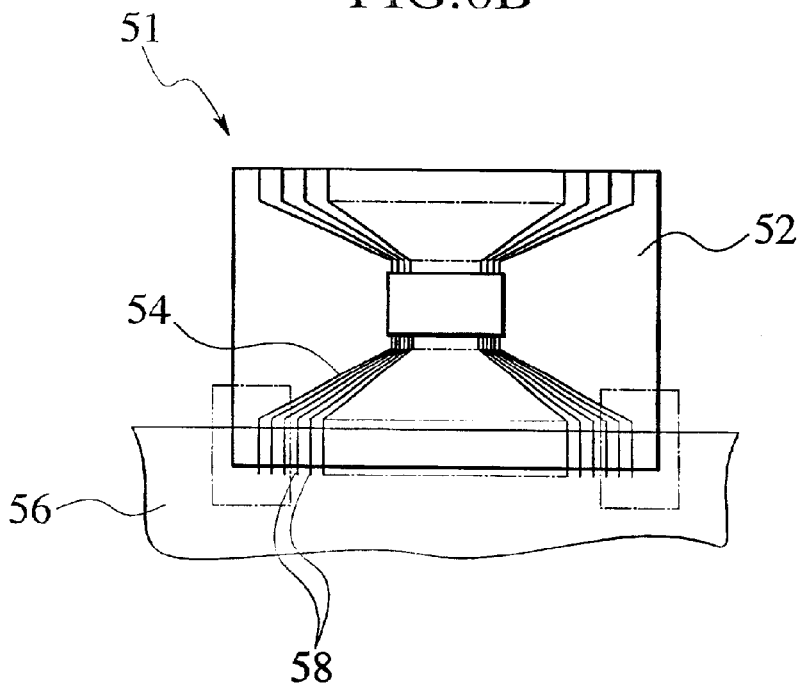

In a concrete example, as shown in FIGS. 6A and 6B, firstly the camera 3 takes a photograph of the first mark MA on the film carrier 52 in the electronic part 51 and of the first mark NA on the transparent plate 56 corresponding to the first mark MA. In addition, the camera 4 then takes a photograph of the second mark MB on the film carrier 52 in the electronic part 51 and of the second mark NB on the transparent plate 56 corresponding to the second mark MB. Following this process, the image processing device 5 obtains the distance D1 between the first mark MA and the second mark MB on the electronic part 51, and the distance D2 between the first mark NA and the second mark NB on the transparent plate 56. The control device 15 then automatically selects the optimum condition (one of condition 1, condition 2, or condition 3) shown in FIG. 5 for the heat bonding based on the following comparison process.

A description will be given of the process for the case where the expansion amount of the film carrier 52 is larger than that of the transparent plate 56.

That is, in a case that a difference "D2−D1" between the distances D1 and D2 is larger than "standard value+X1" and smaller than "standard value+X2" (X1<X2), the condition 3 is selected for the heat bonding. The heat bonding is then performed based on this selected condition 3.

Further, in a case that the difference "D2−D1" is larger than "standard value−X4" and smaller than "standard value−X3"(X4<X3), the condition 2 is selected for the heat bonding. The heat bonding is then performed based on the condition 2.

Furthermore, in a case that the difference "D2−D1" is larger than "standard value−X3" and smaller than "standard value+X1"(within an allowed value), the condition 1 is selected for the heat bonding. The heat bonding is then performed based on this selected condition 1.

Thus, even if both the electronic part 51 and the transparent plate 56 have dimension error, it is possible to perform the heat bonding of the electronic part 51 to the transparent plate 56 without making any faulty product. In the above cases, the standard value is a difference value "D2−D1" based on the design value, and each of X1, X2, X3, and X4 is a positive number.

In the manner described above, the condition for the heat bonding is selected based on a difference in position between the distances D1 and D2, where D1 is a value between the marks MA and MB, and the distance D2 is a value between the marks NA and NB.

However, the present invention is not limited by this manner, for example, it is also possible to select the condition for the heat bonding based on a ratio of the distance D1 between the marks MA and MB and the distance D2 between the marks NA and NB. That is, a ratio R0 (D1/D2×100%) is compared with a ratio R1, where R0 is the ratio of the distance D1 against the distance D2 based on design, and R1 is the ratio of the distance D1 against the actual distance D2.

In this case, when the ratio R1 is greater than "R0+X1" and smaller than "R0+X2" (namely, X1<X2), the condition 2 is selected for the heat bonding. Further, when the ratio R1 is greater than "R0−X4" and smaller than "R0−X3" (namely, X4>X3), the condition 3 is selected for the heat bonding. Furthermore, when the ratio R1 is greater than "R0−X3" and smaller than "R0+X1" (namely, within an allowed value), the condition 1 is selected for the heat bonding.

In the description described above, the marks formed on the first and second component parts are the marks only for detection. However, the present invention is not limited by this, that is, it is needless to say that it is possible to use terminals having a structural feature in phase, and marks that can be distinguished from others.

Moreover, in the embodiment described above, the electronic part 51 is used as the first component part and the transparent plate 56 is used as the second component part, and the present invention is applied to the outer lead bonding device. But, the present invention is not limited by this embodiment, for example, it is possible to apply the present invention to a mounting apparatus for mounting an IC (integrated circuit) chip onto a tape shaped part, wherein the tape shaped part is used as the first component part and the IC chip is used as the second component part.

Still furthermore, the embodiment described above has explained the case where the beater 23 is mounted to the bonding tool 22. However, in the present invention, the heater 23 is not always mounted to the bonding tool 22. For example, it is also possible to mount a heating means such as a heater to a supporting means for supporting the transparent plate 56 against a pressure power applied by the bonding tool 22 during the heat bonding process, and possible to control a heating value of the heating means instead of the control of the temperature of the bonding tool 22.

Furthermore, the condition for the heat bonding includes at least one of a bonding temperature, a bonding pressure, a bonding time, and a bonding speed of the bonding tool for performing the heat bonding for the first component part and the second component part.

As set forth in detail, according to the present invention, the distance between the marks on the first part is measured before performing the heat bonding, and the heat bonding is performed or abandoned based on the distance as a measurement result, so that it is thereby possible to decrease the incidence of faulty products.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A heat bonding device for performing a heat bonding of a first component part to a second component part by using a bonding tool, in which an expansion amount of the first component part is changed according to a condition of the heat bonding, comprising:

an image pickup device configured to take an image of first and second marks formed on the first component part before heat bonding the first component to the second component;

an image processing device configured to obtain a distance between the first and second marks based on the obtained images by the image pickup device; and a control device configured to determine a condition for the bonding tool based on the distance between the marks on the first component part obtained by the image processing device, and configured to control operation of the bonding tool under the determined condition.

2. A heat bonding device for performing a heat bonding of a first component part to a second component part by using a bonding tool, in which an expansion amount of the first component part is changed according to a condition of the heat bonding, comprising:

an image pickup device configured to take an image of first and second marks formed on the first component part and configured to take an image of first and second marks formed on the second component part which correspond to the first and second marks formed on the first component part before heat bonding the first component to the second component;

an image processing device configured to obtain a distance between the first and second marks formed on the first component part, and configured to obtain a distance between the first and second marks on the second component part based on the image, obtained by the image pickup device; and a control device configured to determine a condition for the bonding tool based on the obtained distances of the marks on the first and second component parts, and configured to control the heat bonding for the first and second component parts by the bonding tool under the determined condition.

3. The heat bonding device as claimed in claim 1, wherein the condition comprises at least one of a bonding temperature, a bonding load, a bonding time, and a bonding speed of the bonding tool.

4. The heat bonding device as claimed in claim 2, wherein the condition comprises at least one of a bonding temperature, a bonding load, a bonding time, and a bonding speed of the bonding tool.

* * * * *